US012575225B2

(12) United States Patent
Xu et al.

(10) Patent No.: US 12,575,225 B2
(45) Date of Patent: Mar. 10, 2026

(54) METHODS OF PRODUCING SINGLE PHOTON EMITTERS ON SUBSTRATES, AND DEVICES, AND CHIPS

(71) Applicant: Purdue Research Foundation, West Lafayette, IN (US)

(72) Inventors: Xiaohui Xu, Lafayette, IN (US); Zachariah Olson Martin, West Lafayette, IN (US); Demid Sychev, West Lafayette, IN (US); Alexei S. Lagutchev, West Lafayette, IN (US); Yong Chen, West Lafayette, IN (US); Vladimir Michael Shalaev, West Lafayette, IN (US); Alexandra Boltasseva, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 652 days.

(21) Appl. No.: 17/845,093

(22) Filed: Jun. 21, 2022

(65) Prior Publication Data

US 2022/0406962 A1     Dec. 22, 2022

Related U.S. Application Data

(60) Provisional application No. 63/212,924, filed on Jun. 21, 2021.

(51) Int. Cl.
*H10H 20/81*     (2025.01)
*G01Q 60/36*     (2010.01)
*H10H 20/01*     (2025.01)
*H10H 20/825*     (2025.01)

(52) U.S. Cl.
CPC ....... *H10H 20/8215* (2025.01); *G01Q 60/366* (2013.01); *H10H 20/0137* (2025.01); *H10H 20/825* (2025.01)

(58) Field of Classification Search
CPC ............. H10H 20/0133; H10H 20/818; H10H 20/825; H10H 20/0137; H10H 20/01335; H10H 20/8215; G01Q 60/366; G01Q 80/00; B82Y 20/00
See application file for complete search history.

(56) References Cited

U.S. PATENT DOCUMENTS

2019/0288160 A1*   9/2019   Atature ................ H10H 29/142
2020/0013991 A1*   1/2020   Wang .................... G01K 11/00
2020/0259065 A1*   8/2020   Alemán .............. H10H 20/825

* cited by examiner

*Primary Examiner* — Vongsavanh Sengdara
(74) *Attorney, Agent, or Firm* — Hartman Global IP Law; Gary M. Hartman; Domenica N.S. Hartman

(57) ABSTRACT

Methods of fabricating single photon emitters (SPEs) including nanoindentation of hexagonal boron nitride (hBN) host materials and annealing thereof, devices formed from such methods, and chips with a single photon emitter. A substrate with a layer of hBN is provided. Nanoindentation is performed on the layer of hBN to produce an array of sub-micron indentations in the layer of hBN. The layer of hBN is annealed to activate SPEs near the indentations. Devices include a substrate with an SPE produced in accordance with the methods. Chips include a substrate, an hBN layer, and an SPE including an indentation on the hBN layer, in which the substrate is not damaged at the indentation.

18 Claims, 13 Drawing Sheets

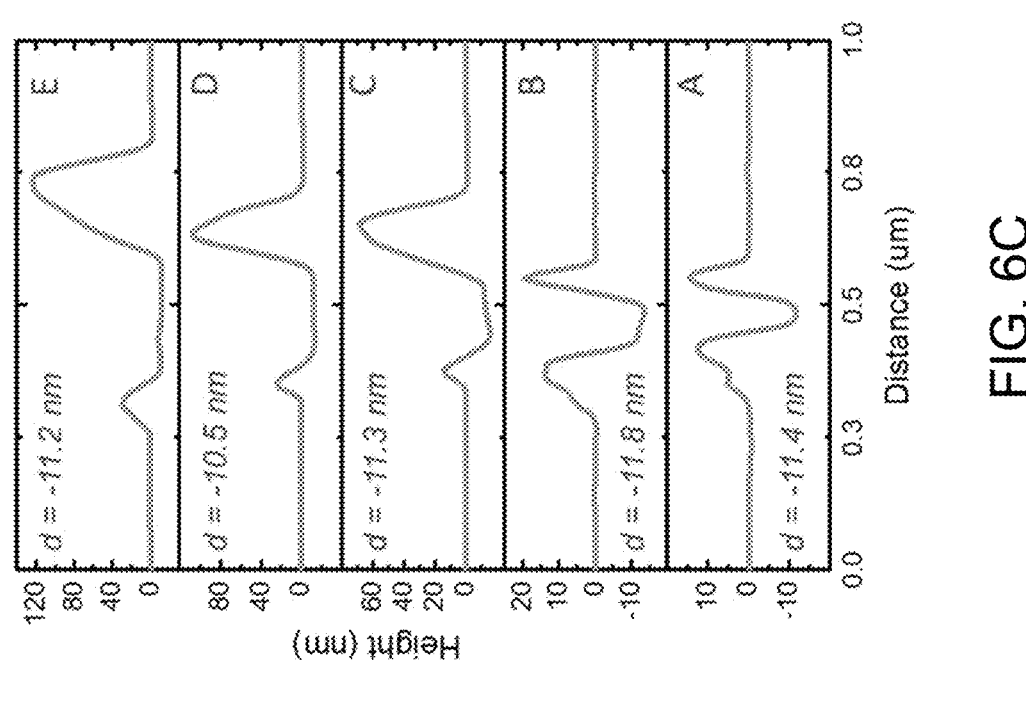
FIG. 6C
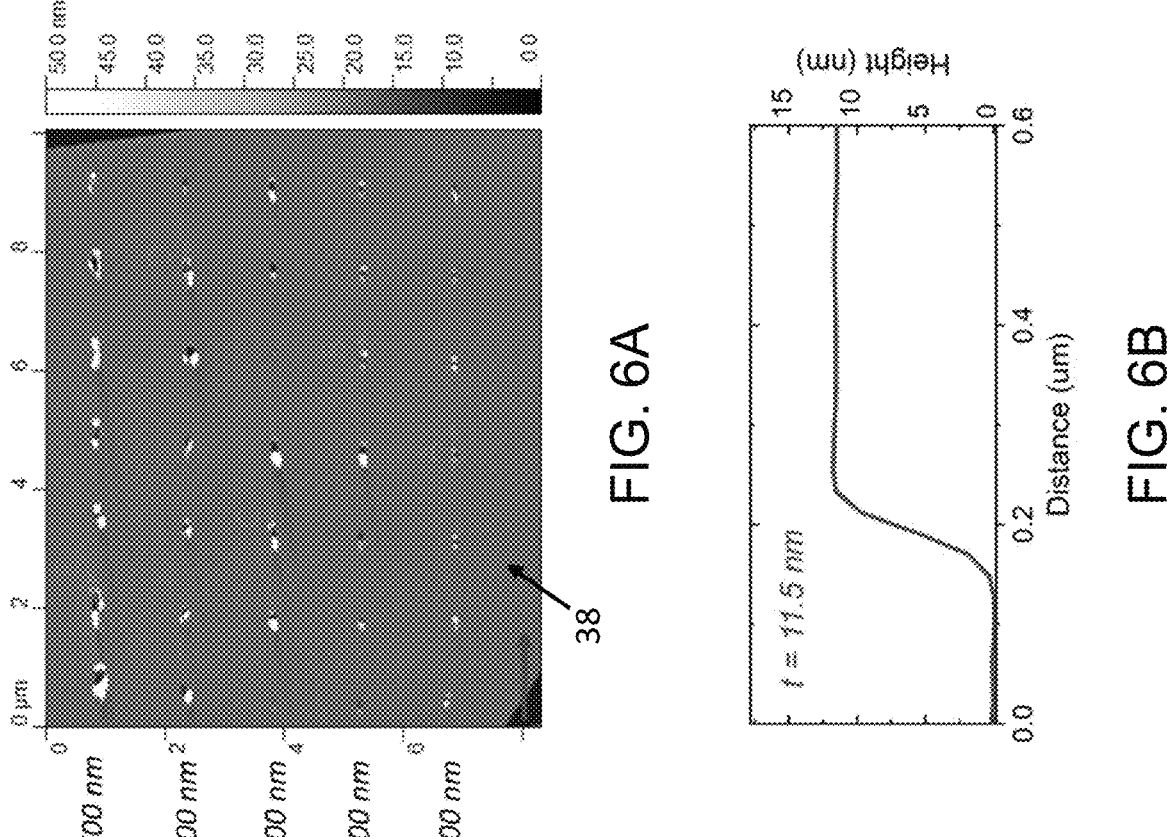
FIG. 6A
FIG. 6B

METHODS OF PRODUCING SINGLE PHOTON EMITTERS ON SUBSTRATES, AND DEVICES, AND CHIPS

CROSS REFERENCE TO RELATED APPLICATIONS

The present application claims the benefit of provisional U.S. Patent Application No. 63/212,924, filed Jun. 21, 2021, the contents of which are incorporated herein by reference.

STATEMENT REGARDING FEDERALLY-SPONSORED RESEARCH OR DEVELOPMENT

This invention was made with government support under 2015025-ECCS awarded by National Science Foundation and DE-AC05-00OR22725 awarded by the Department of Energy. The government has certain rights in the invention.

BACKGROUND OF THE INVENTION

The present invention generally relates to single photon emitters (SPEs). The invention particularly relates to methods of fabricating SPEs including nanoindentation of hexagonal boron nitride (hBN) host materials and annealing thereof, devices formed from the methods, and a chip with a single photon emitter.

Solid-state SPEs are receiving increasing attention in the last decade due to their critical role in quantum information technologies including quantum computing, secure quantum communication, etc. Such SPEs are typically composed of atomic defect structures in a solid-state host material that are suitable for integrated quantum photonic systems. Recently, two-dimensional (2D) van der Waals materials such as transition-metal dichalcogenides (TMDCs) and hexagonal boron nitride (hBN) have been extensively investigated due to their capability to host SPEs. For instance, various types of SPEs operating at ambient conditions have been identified in hBN, with emission ranging from ultra-violet (UV) to the near infra-red (NIR) spectral regime. The atomic-scale thickness of 2D hBN not only enables high-efficiency light extraction, but also offers unparalleled advantages for integrating SPEs with plasmonic and photonic structures for hybrid quantum devices.

The practical integration of SPEs in 2D materials requires deterministic creation or activation of emitters at designated locations. Recent studies have reported a few methods to fabricate position-controlled SPEs in 2D materials based on strain engineering, ion/electron beam irradiation and controlled bottom-up growth. Strain/curvature-induced SPEs in hBN and TMDCs have been fabricated either by employing a nano-structured substrate (e.g., with nanopillars, nanocones, etc.), or by deforming the 2D materials into a soft polymetric substrate. However, both approaches have limited applications in quantum integrated photonics due to the involvement of patterned substrates or polymers. A similar strategy was utilized in a recent work to obtain SPEs that are not purely strain-induced in hBN, by growing hBN on dielectric nanopillars using chemical vapor deposition (CVD). Aside from the above-mentioned methods, gallium focused ion beam (FIB) and electron beam have been demonstrated to create position-controlled SPEs in hBN flakes on a flat substrate. However, the fluorescence contamination induced by high-energy gallium ion implantation could be a potential concern in practice, and SPE activation by electron beam suffers from limited spatial precision (larger than 1 μm). Therefore, the above-noted techniques are limited in that they either rely on a patterned substrate that is not compatible with integrated photonic devices or utilize a radiation source that might cause unpredictable damage on hBN and underlying substrates.

In view of the above, it can be appreciated that there are certain problems, shortcomings or disadvantages associated with SPE fabrication techniques, and that it would be desirable if methods were available for producing SPEs on chip-compatible substrates that were capable of at least partly overcoming or avoiding the problems, shortcomings or disadvantages noted above.

BRIEF DESCRIPTION OF THE INVENTION

The present invention provides methods of producing SPEs on chip-compatible substrates, devices formed by such methods, and chips with one or more SPEs.

According to one nonlimiting aspect of the invention, a method is provided for producing single photon emitters (SPEs) on a substrate. The method includes providing a substrate having a layer of hexagonal boron nitride (hBN) thereon, performing nanoindentation of the layer of hBN to produce an array of sub-micron indentations in the layer of hBN on the substrate, and annealing the layer of hBN having the sub-micron indentations thereon to activate single-photon emitters (SPEs) near the indentations.

According to other nonlimiting aspects, the method optionally includes one or more variations and/or features, including but not limited to: the substrate may include an $SiO_2$-coated Si substrate; the layer of hBN may include one or more hBN flakes; the hBN flakes may be flexible in terms of thickness; the method may include producing the substrate by depositing exfoliated hBN flakes on a non-patterned, planar surface of a $SiO_2$-coated silicon substrate; the SPEs may emit at room-temperature; the performing nanoindentation may be performed with an atomic force microscope (AFM); the performing nanoindentation of the layer of hBN may be performed so as to not deform the substrate; the performing nanoindentation may be accomplished with no fluorescent contaminants being introduced to the layer of hBN on the substrate; the indentations may include lateral dimensions between 150 nm and 800 nm formed by controlling vertical displacement of an indenter tip of a nanoindenter in the step of performing nanoindentation; at least some of the SPEs may have emission wavelengths of about 583 nm or about 602 nm; at least 80% of the SPEs may have zero phonon lines (ZPLs) centered at either about 583 nm or about 602 nm; the substrate may be a chip-compatible substrate; the annealing may be performed in an argon atmosphere at up to 1000° C. for at least 30 minutes; the indentations may be defined by a recess in the layer of hBN with bent portions of the layer of hBN adjacent thereto; the indentations may include sharp, well-defined edges; and/or the annealing may produce an SPE yield of up to 32%.

According to another nonlimiting aspect of the invention, a device is provided that includes a substrate having one or more SPEs thereon produced in accordance with methods disclosed herein. The device may form and/or be part of a plasmonic device or a photonic device, for example.

According to another nonlimiting aspect of the invention, a chip includes a substrate, an hBN layer disposed on the substrate, and a single proton emitter (SPE) including an indentation in the hBN layer. The substrate is not damaged at the indentation.

According to other nonlimiting aspects, the indentation includes a dip in the hBN layer and a bent hBN piece immediately adjacent the dip, the chip includes a plurality of the SPEs in the hBN layer, the indentations of the plurality of SPEs are disposed in an array across the substrate and the hBN layer, and/or the array is a non-random pattern.

Technical effects of the method described above preferably include the ability to controllably and reliably fabricate SPEs on chip-compatible substrates.

Other aspects and advantages of this invention will be appreciated from the following detailed description.

BRIEF DESCRIPTION OF THE DRAWINGS

FIG. 3A includes second-order autocorrelation measurements of emitters A and B. Blue circles are experimental data while blue solid lines are fitted curves using the three-level model. Both emitters show $g^2(0)<0.5$ indicative of single photon emission. FIG. 3B includes distribution of radiative lifetimes from all 31 hBN SPEs, extracted from $g^2(t)$ fitting. FIG. 3C includes a fluorescence saturation curve of a typical SPE with a saturation count of 1.1 Mcps. The inset represents an emission polarization plot of a hBN SPE. FIG. 3D includes distribution of ZPLs for 26 photostable SPEs as a function of corresponding lateral indent size, revealing three groups of emitters with ZPLs at 582±6 nm, 602±9 nm, and 633±5 nm, respectively. The shaded bands are visual aids.

FIG. 6A includes an AFM image of an hBN flake after nanoindentation. Indents in the same row were created with the same maximum cantilever displacement $\Delta z_{max}$ as indicated on the left axis.

FIG. 6B represents a height profile along the solid red arrow in FIG. 6A, showing a flake thickness t=11.5 nm.

FIG. 6C represents height profiles across the indents noted as A-E along the blue arrows in FIG. 6A. Value of d noted for each indent in the plot indicates the measured indentation depth. As illustrated in FIG. 6C, while the lateral indent size increases monotonically with $\Delta z_{max}$, the indentation depth showed little dependence on $\Delta z_{max}$, with magnitudes comparable or less than the flake thickness for all $\Delta z_{max}$ values tested.

DETAILED DESCRIPTION OF THE INVENTION

Figure 1:
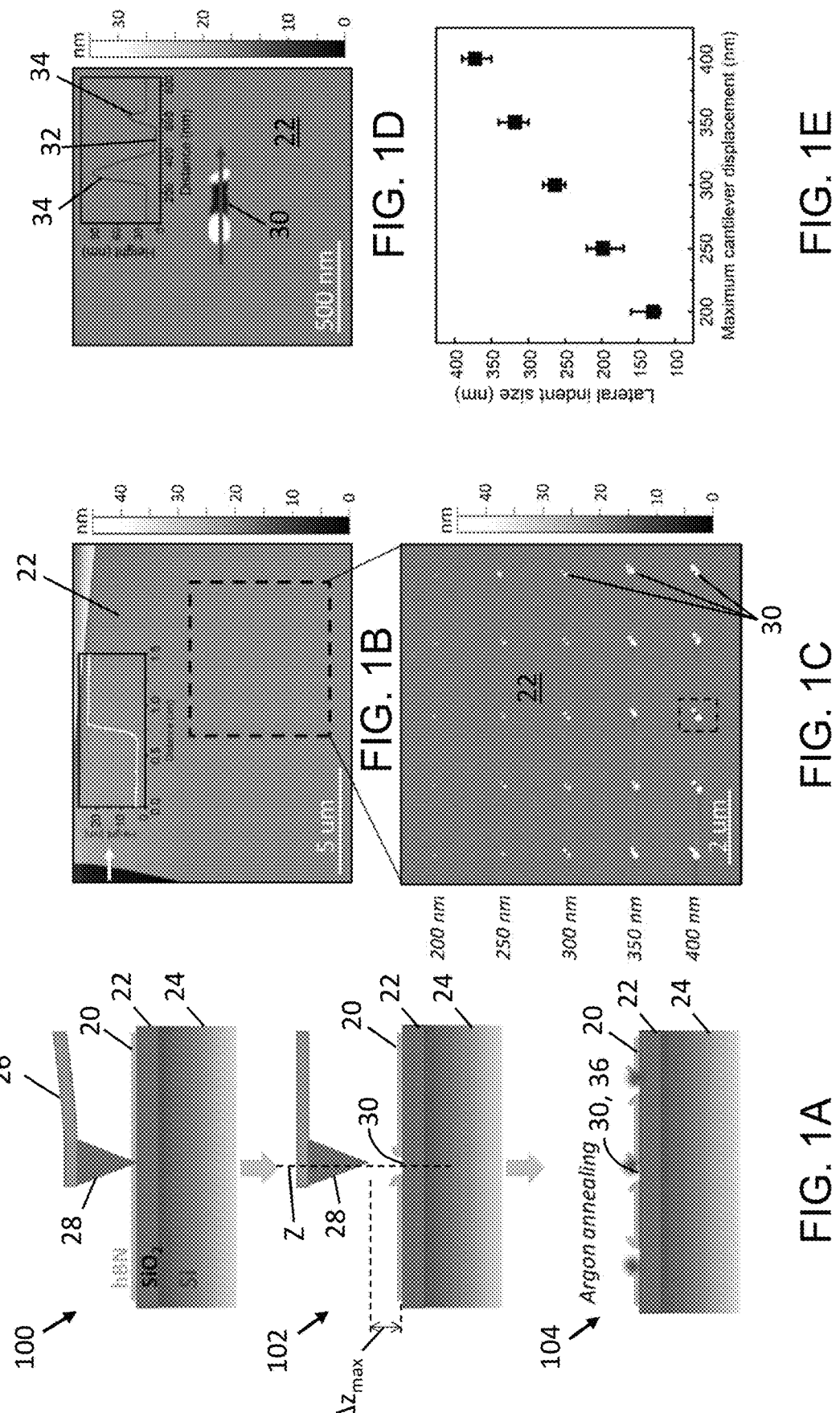
FIG. 1A schematically represents a method of activation of SPEs in hBN with atomic force microscope (AFM) nanoindentation followed by high temperature annealing in argon.
FIG. 1B includes an AFM image showing a thin hBN flake used for demonstrating the nanoindentation process. The upper inset represents a height profile collected at the flake edge along the white arrow, showing a flake thickness of 19.8 nm. Scale bar: 5 μm (micrometer units are indicated by "um" in the drawings).
FIG. 1C includes an AFM image of the area inside the dashed box in FIG. 1B after nanoindentation. The left axis lists values of maximum cantilever displacement along the vertical direction ($\Delta z_{max}$) during indentation for each row of indents.
FIG. 1D includes an enlarged view of one specific indent inside the black dashed box in FIG. 1C, showing a dimple in the flake as well as two broken hBN areas next to the dimple. The image was scanned at 45° with respect to the image in FIG. 1C to present the indent along the horizontal direction. The inset represents a height profile collected across the indent along the red arrow.
FIG. 1E illustrates dependence of lateral indent size as a function of the maximum cantilever displacement $\Delta z_{max}$.

The intended purpose of the following detailed description of the invention and the phraseology and terminology employed therein is to describe what is shown in the drawings, which include the depiction of one or more nonlimiting embodiments of the invention, and to describe certain but not all aspects of what is depicted in the drawings. The following detailed description also describes certain investigations relating to the embodiment(s) and identifies certain but not all alternatives of the embodiment(s). As nonlimiting examples, the invention encompasses additional or alternative embodiments in which one or more features or aspects shown and/or described as part of a particular embodiment could be eliminated, and also encompasses additional or alternative embodiments that combine two or more features or aspects shown and/or described as part of different embodiments. Therefore, the appended claims, and not the detailed description, are intended to particularly point out subject matter regarded to be aspects of the invention, including certain but not necessarily all of the aspects and alternatives described in the detailed description.

Disclosed herein are methods for deterministically activating room-temperature hexagonal boron nitride (hBN) single-photon emitters (SPEs) by nano-indenting a substrate comprising hBN, for example, with an atomic force microscope (AFM), followed by argon annealing sufficient to fully activate SPEs at the indented sites. Although the methods will be discussed herein in reference to using an AFM for nanoindentation, the method may alternatively use any nanoindenter configured to insert a hard, sharpened indenter tip with a well-defined shape against a surface of a sample to form a sub-micron sized indentation. However, it is believed that AFM is a particularly convenient technology for use in the method as it allows for both precise indentation positioning as well as subsequent analysis of the produced indents.

In certain embodiments, the method includes locating exfoliated thin hBN flakes on a non-patterned (flat) $SiO_2$-coated silicon substrate. AFM probes with a diamond-like coating material are used to indent the hBN, without notable damage to the substrates therebelow. This method is contamination-free, with no additional fluorescent contaminants introduced to hBN, in contrast to radiation-based or fabrication-based processes. By controlling the AFM probe displacement along a vertical direction (perpendicular to the hBN flakes and/or substrate), lateral indentation sizes ranging from about 150 nm up to about 800 nm have been achieved with good repeatability. The nano-indentation is followed by argon annealing to fully activate SPEs at the indented sites. This method allows for fabrication of site-controlled hBN SPEs on chip-compatible substrates and promotes realization of integrated quantum photonics based on hBN SPEs. The capability to controllably pattern an array of quantum emitters also opens exciting possibilities such as realizing a "quantum mirror."

Nonlimiting embodiments of the invention will now be described in reference to experimental investigations leading up to the invention.

FIG. 1A represents a nanoindentation technique and method based on AFM that was used during certain investigations leading to aspects of the method discussed above. At 100, a two-layer substrate (22, 24) is provided that has a layer 20 of hBN thereon. In this technique, hBN flakes 20 were exfoliated from high-quality hBN crystals and transferred to a $SiO_2$-coated 22 Si substrate 24. After solvent cleaning, thin flakes (e.g., less than 25 nm in thickness) were selected using an optical microscope. Such thin flakes are flexible in terms of thickness. FIG. 1B shows an AFM image of a typical hBN flake. The flake 20 had a thickness of about 19.8 nm and a roughness of about 230 pm, indicating an extremely clean and smooth surface. At 102, nanoindentation is performed on the layer 20 of hBN. In the AFM contact mode, a cantilever 26 coated with a diamond-like carbon indenter tip 28 (also called a probe) was brought into contact with an hBN flake 20 and was indented into the flake with further cantilever displacement along the vertical direction Z with a displacement velocity of 100 nm/s.

To ensure effective indentation, the cantilever 26 was held at its maximum displaced position for two seconds before retraction. By adjusting the maximum cantilever displacement ($\Delta z_{max}$), indents 30 with varying lateral sizes were obtained, as shown in FIG. 1C. In this example, five indents were produced in each row that were created with the same $\Delta z_{max}$. FIG. 1D represents an image of an exemplary indent structure of one of the indents 30 in FIG. 1C with a line profile extracted across the indented area. As represented in FIG. 1D, the area was composed of a dip 32 created in hBN as well as two bent hBN pieces 34, for example immediately adjacent and disposed on opposite sides of the dip 32, resulting from impact by the AFM probe 28.

Figures 5A, 5B:
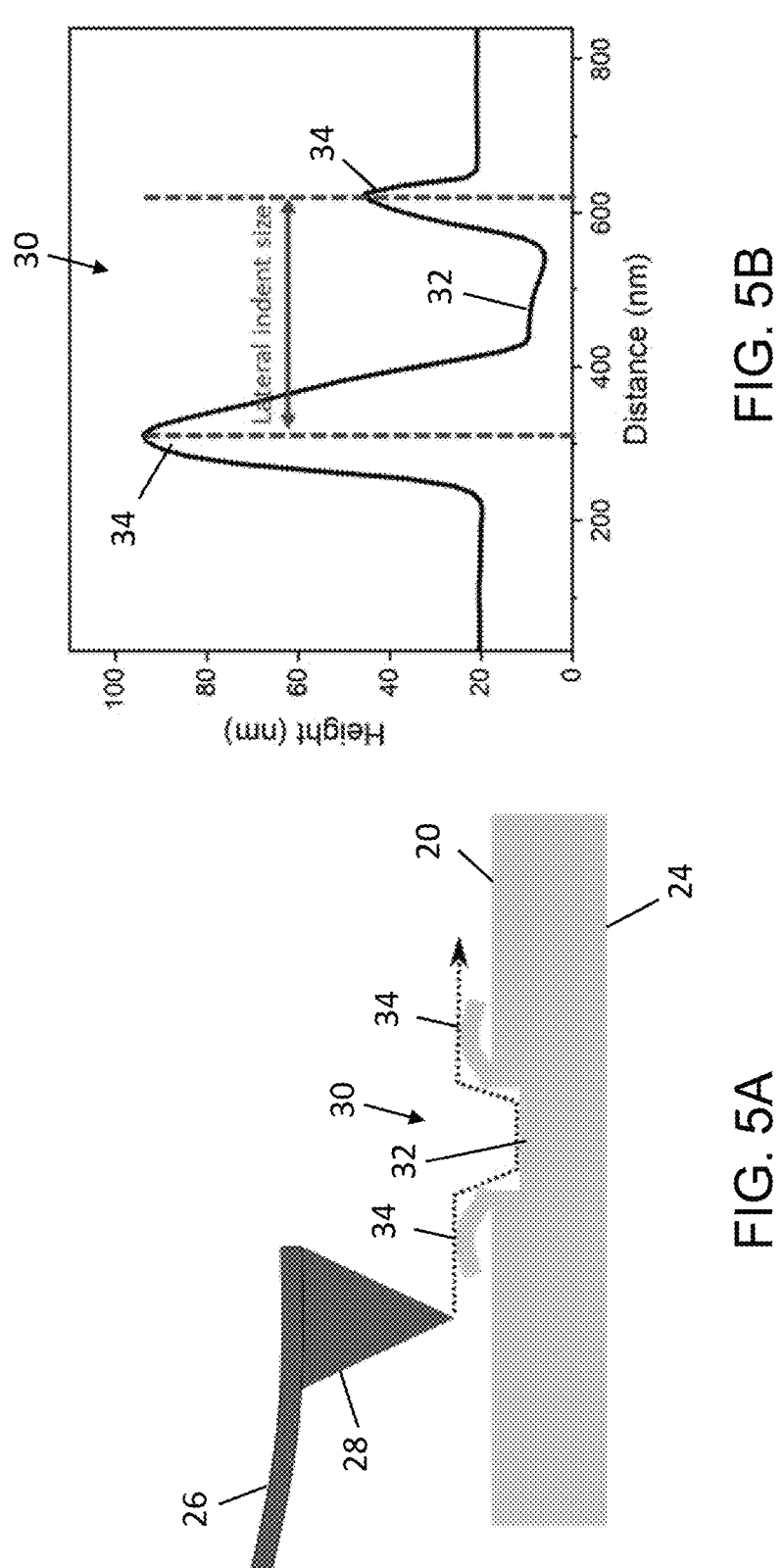
FIG. 5A schematically represents an effect of an AFM cantilever when scanning an indent structure in hBN. Due to the width of the AFM tip, the indent profile cannot be accurately reproduced.
FIG. 5B represents definition of the lateral indent size as used herein, which refers to the distance between the two highest points across the indent. The height profile is taken from FIG. 1D.

To demonstrate how the lateral size of indented dimples in hBN scaled with the cantilever displacement, all of the indent sizes in FIG. 1C were measured and plotted as a function of $\Delta z_{max}$ as represented in FIG. 1E. For these investigations, lateral indent size was determined to be a distance between the two highest features across the indent, as represented in FIG. 5B, rather than taking the length of the recessed portion of the AFM height profile as the indent size. This was based on the knowledge that when using an AFM probe to scan a feature that is lower than the surface, such as an indent, the lateral size of the indent can appear smaller than its actual size due to the width of the AFM probe (represented in FIG. 5A).

The lateral indent size was observed to scale almost linearly with $\Delta z_{max}$ in the tested $\Delta z_{max}$ range. It was also noted that changing $\Delta z_{max}$ mainly affected the lateral dimension, rather than the depth of resulting indents. As represented in FIGS. 6A through 6C, the indentation 30 typically created dimples with depths less than or comparable to the hBN flake thickness even for the largest indents tested. This implied that this indentation procedure "pokes" (e.g., contacts and deforms) hBN without deforming or damaging the substrate.

The results of this investigation were in contrast with previously reported AFM indentation experiments on TMDCs, where TMDC layers were completely deformed into indented dips with depths depending on $\Delta z_{max}$, without being torn apart by cantilevers. It was theorized that this was due to the use of a relatively rigid substrate (SiO₂-on-Si) 22 and 24 in the present investigation that was not amenable to deformation, while in the previous studies reported a soft polymer substrate was used to facilitate the downward deformation of the TMDC layer. The difference between hBN and TMDCs in terms of their mechanical properties could also play an important role here. For example, high-quality hBN thin films around 15 nm thick were reported to have a Young's Modulus of about 1.2 TPa, which is more than four times larger than the Young's Modulus of TMDCs. This indicates that hBN is a stiffer material than TMDCs and tends to break more easily before significant deformation. An additional factor may be the different types of cantilevers used among studies in terms of coating material, tip radius, etc., which might lead to varied cantilever-sample interactions and sample responses. In the method of the present disclosure, the indentation of hBN flakes without notable damage into substrates was, in fact, of an unexpected advantage in practical applications where hBN flakes are placed on photonic components such as waveguides, resonators, cavities, etc.

Figure 2:
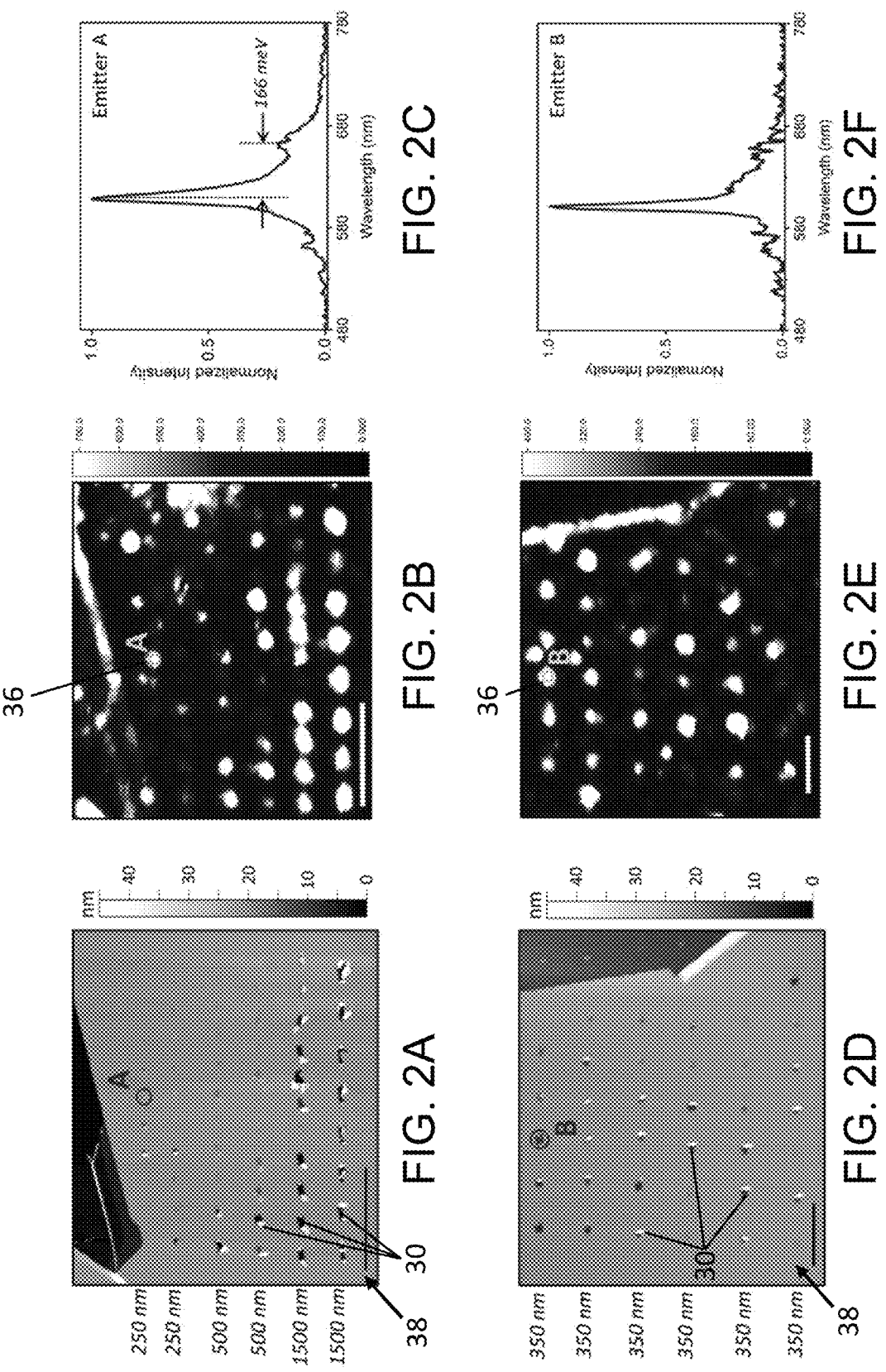
FIG. 2A includes an AFM image of a first flake after nanoindentation. Six rows of indents were created with the values of $\Delta z_{max}$ indicated on the left axis for each row. From top to bottom, the number of indents in each row is 5, 11, 11, 9, 10 and 8, respectively. Scale bar: 5 μm.
FIG. 2B includes a photoluminescence (PL) map from the same area shown in FIG. 2A after argon annealing. Scale bar: 5 μm.
FIG. 2C includes a background-subtracted spectrum from a representative emitter A circled in FIGS. 2A and 2B. A phonon sideband (PSB) that was 166 meV away from the zero phonon line (ZPL) at 608 nm was identified.
FIG. 2D includes an AFM image of a second flake after nanoindentation. Six rows of indents were created with the same $\Delta z_{max}$ of 350 nm. From top to bottom, the number of indents in each row is 5, 6, 6, 6, 6 and 7, respectively. Scale bar: 2 μm.
FIG. 2E includes a PL map of the same area shown in FIG. 2D after argon annealing. Scale bar: 2 μm.
FIG. 2F includes a background-subtracted spectrum from a representative emitter B circled in FIGS. 2D and 2E, showing a sharp ZPL line centered at 602 nm.

After nanoindentation, an annealing step 104 was performed to activate SPEs 36 in the hBN layer 20 while simultaneously removing any organic residues that may be present from the exfoliation process. The prepared samples were annealed in argon at 1000° C. for 30 minutes to achieve efficient SPE activation. Two types of AFM indented hBN samples were annealed and characterized: one with varied indentation sizes on the same flake to investigate the correlation between indent sizes and SPE generation, and another with a single indent size combining a high SPE yield and indentation precision. FIG. 2A represents an exemplary hBN flake that was about 19.5 nm thick (FIG. 6A) and had dimples indented with three different $\Delta z_{max}$, namely, 250 nm (group 1), 500 nm (group 2) and 1500 nm (group 3).

Figures 7A, 7B, 7C, 7D:
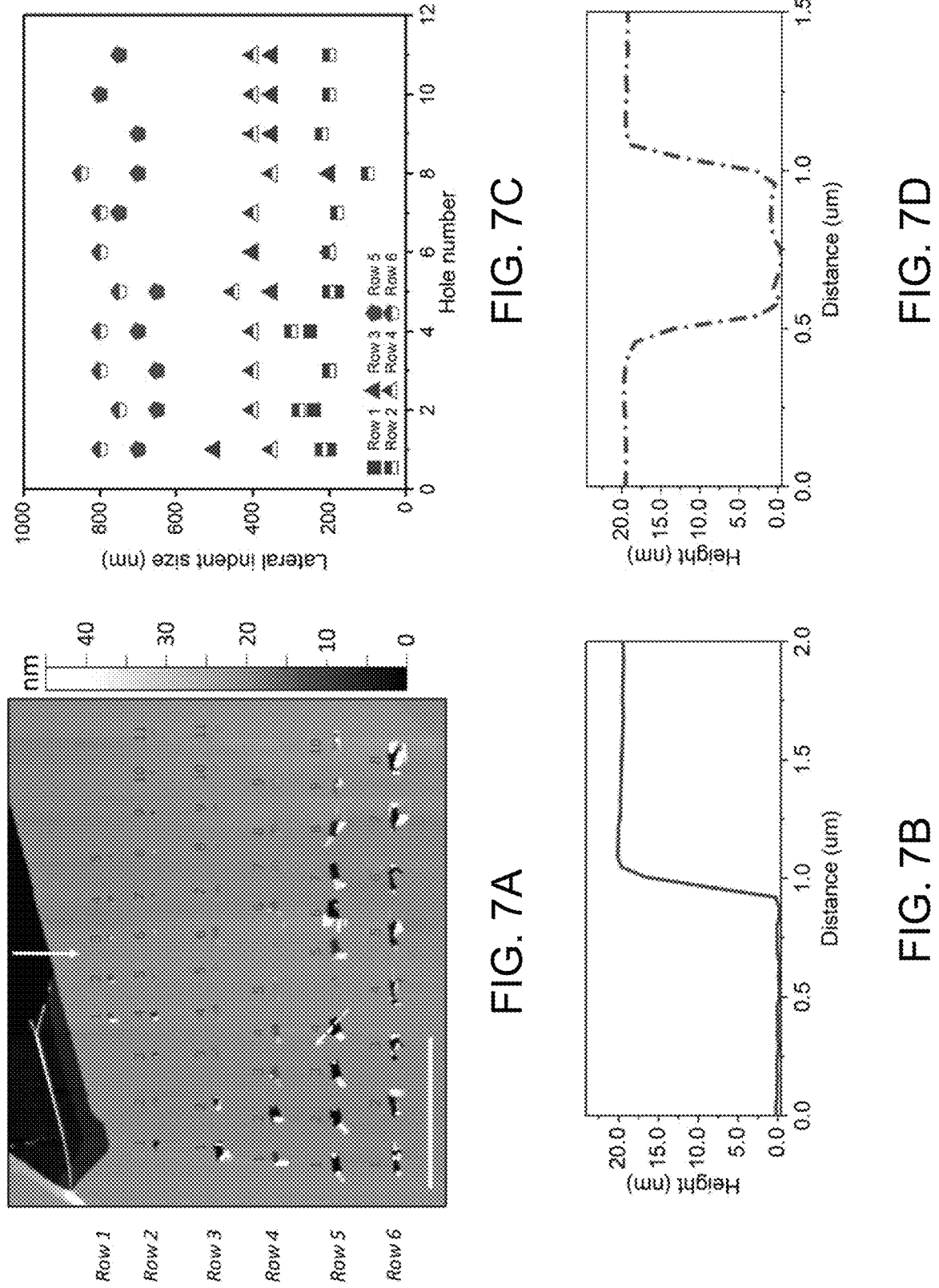
FIG. 7A includes an AFM image of the same flake shown in FIG. 2A, with all indents numbered for reference. Scale bar: 5 μm.
FIG. 7B represents a height profile at the flake edge along the solid white arrow in FIG. 7A, showing a flake thickness of 19.5 nm.
FIG. 7C represents distribution of the lateral indent size for all indents in FIG. 7A. Note: the indent sizes were measured along the lateral (horizontal) direction.
FIG. 7D represents a height profile of one of the largest indents (in terms of lateral size) in FIG. 7A, that is, indent number 4 in row 5, along the white dashed arrow, showing an indent depth comparable with the flake thickness.

Here, relatively large step sizes in $\Delta z_{max}$ between the groups were used compared to the demonstration in FIGS. 1B through 1E, which assisted in extracting the dependence of SPEs on the lateral indent size in a broader size range. The lateral size distribution of all indents 30 can be found in FIGS. 7A through 7D. Average indent sizes of 200 nm, 400 nm and 750 nm were measured in the three groups above. It should be noted that an indent size of 750 nm for $\Delta z_{max}$=1500 nm no longer fit into the linear relationship represented in FIG. 1E. However, fitting for indents 30 larger than 500 nm was out of the scope of this experiment since smaller indents are preferred in practice. Even for $\Delta z_{max}$ as large as 1500 nm, the depth of resulting indents was still comparable to the hBN flake thickness (FIG. 7D), again confirming that this technique has negligible impact on substrates. Overall, the indentation procedure was observed to produce a designated indent size reliably. To further narrow down the size distribution of indents 30 created by a given $\Delta z_{max}$, adjustments may be made to the parameters in the nanoindentation procedure, such as the indentation trigger point, cantilever extension/retraction velocity, dwell time at $\Delta z_{max}$, etc.

After annealing in an inert atmosphere (in this case, argon (Ar)), the flake 20 was scanned with a custom confocal microscope at room temperature. A 532 nm continuous wave (CW) pump laser was used for scanning at a laser power of 800 uW. A photoluminescence (PL) map from the AFM-indented area is represented in FIG. 2B. Bright, isolated spots are identified at positions corresponding to indented areas, with low background emission rates away from these spots. Spectroscopic measurements reveal that PL spectra from those bright spots typically showed well-defined emission peaks on top of a low background. FIG. 2C is a representative spectrum collected from a spot labeled as emitter A in FIGS. 2A and 2B. There was a sharp emission peak observed at 608 nm (2.04 eV) that matched one of the reported zero-phonon lines (ZPLs) of hBN emitters (602 nm). A broader peak that was observed about 166 meV away from the ZPL was recognized as a phonon sideband (PSB) corresponding to the in-plane optical phonons of hBN. This confirmed that the technique was capable of activating room-temperature emitters 36 in hBN at indents as small as 200 nm in diameter.

Figures 8A, 8B, 8C:
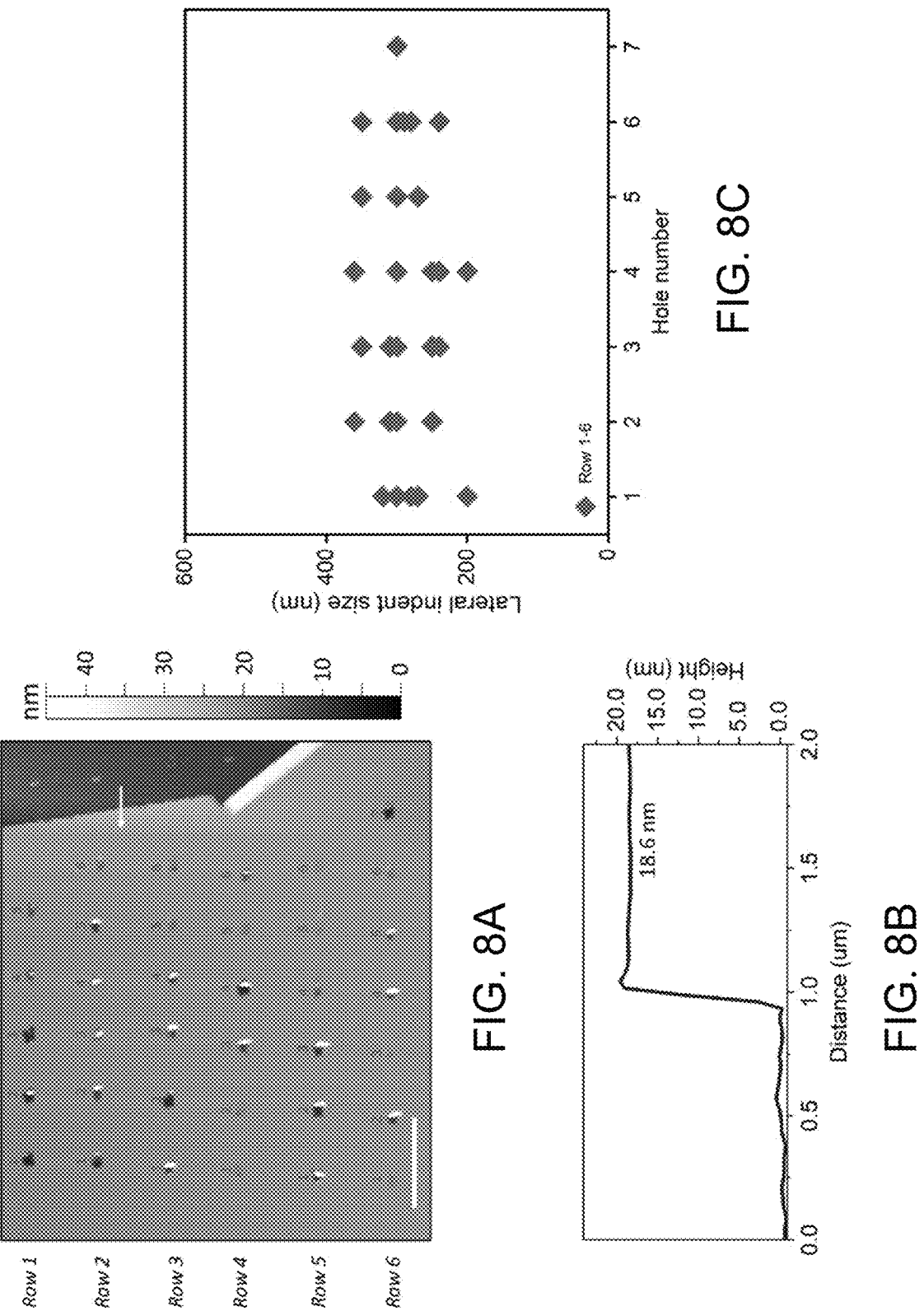
FIG. 8A includes an AFM image of the same flake shown in FIG. 2D, with all indents numbered for reference. Scale bar: 2 μm.
FIG. 8B represents a height profile at the flake edge along the solid white arrow in FIG. 8A, showing a flake thickness of 18.6 nm.
FIG. 8C represents distribution of the lateral indent size for all indents in FIG. 8A.

Another important observation from FIG. 2B was that the yield of bright emission spots increased monotonically with the indent size. While a high emitter yield would be desired, it is also preferable to work with emitters 36 from relatively small indents such that the integration of emitters with photonic structures can be achieved with better precision. To balance the above two factors, another flake 20 was nanoindented with a maximum cantilever displacement of 350 nm. Advantages of this specific $\Delta z_{max}$ will be discussed hereinafter. As seen in FIG. 2D, nanoindentation reproduced arrays 38 of indents 30 with comparable sizes (FIGS. 8A through 8C). The array 38 is a patterned array of indents 30 in a pre-defined pattern. The arrays 38 shown in the present examples are generally rectangular arrays 38. However, other array patterns are also possible. An average indent size of 290 nm was measured along the lateral (horizontal) direction. A PL map of this area (FIG. 2E) again showed arrays of bright emission spots that match well with the AFM indentation pattern. The PL spectrum of a typical emitter labeled as emitter B in the area (FIG. 2F) had a sharp ZPL emission centered at 602 nm (2.06 eV).

Figure 3:
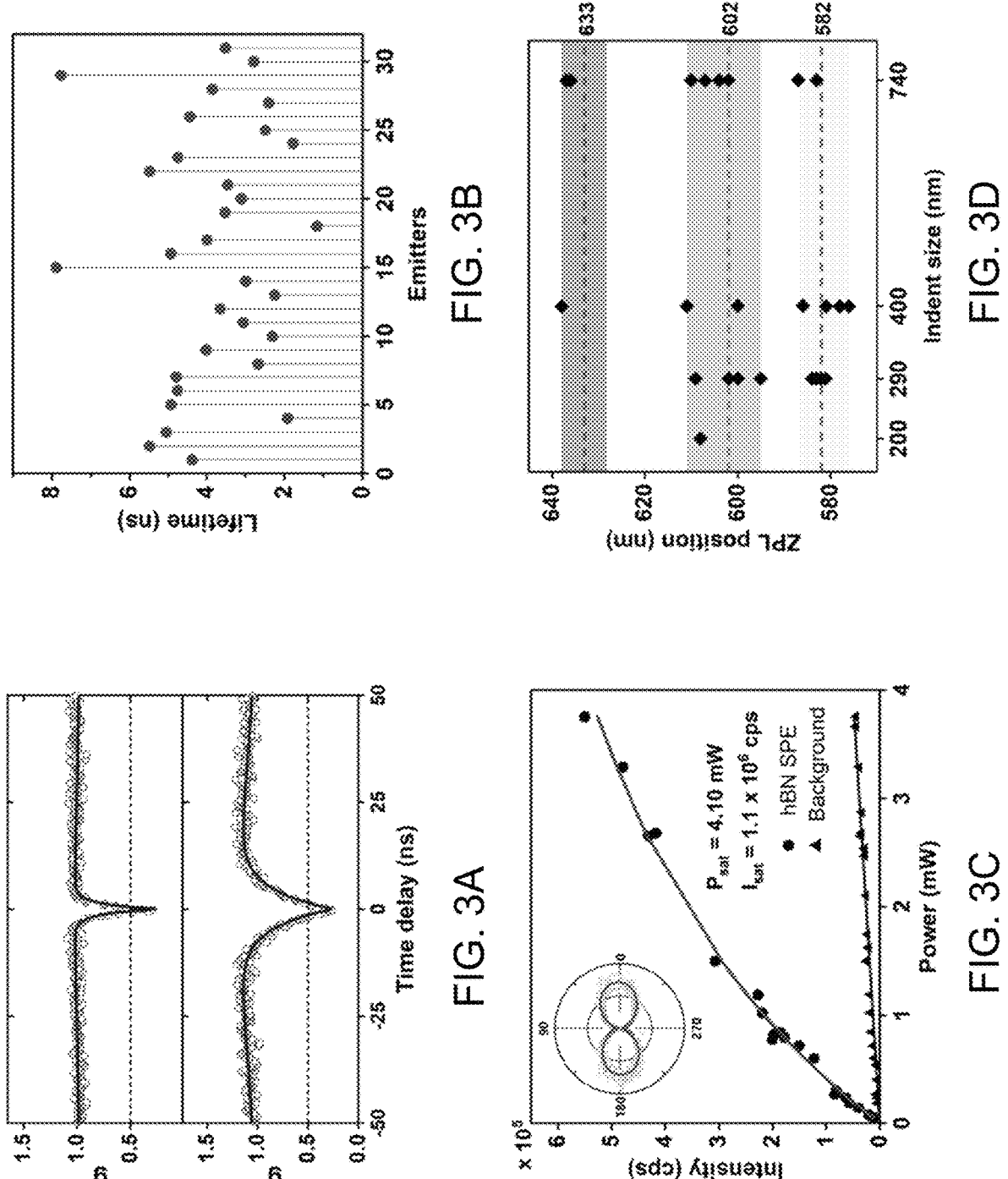
FIGS. 3A through 3D represent photophysical properties of hBN emitters.
Figures 9A, 9B:
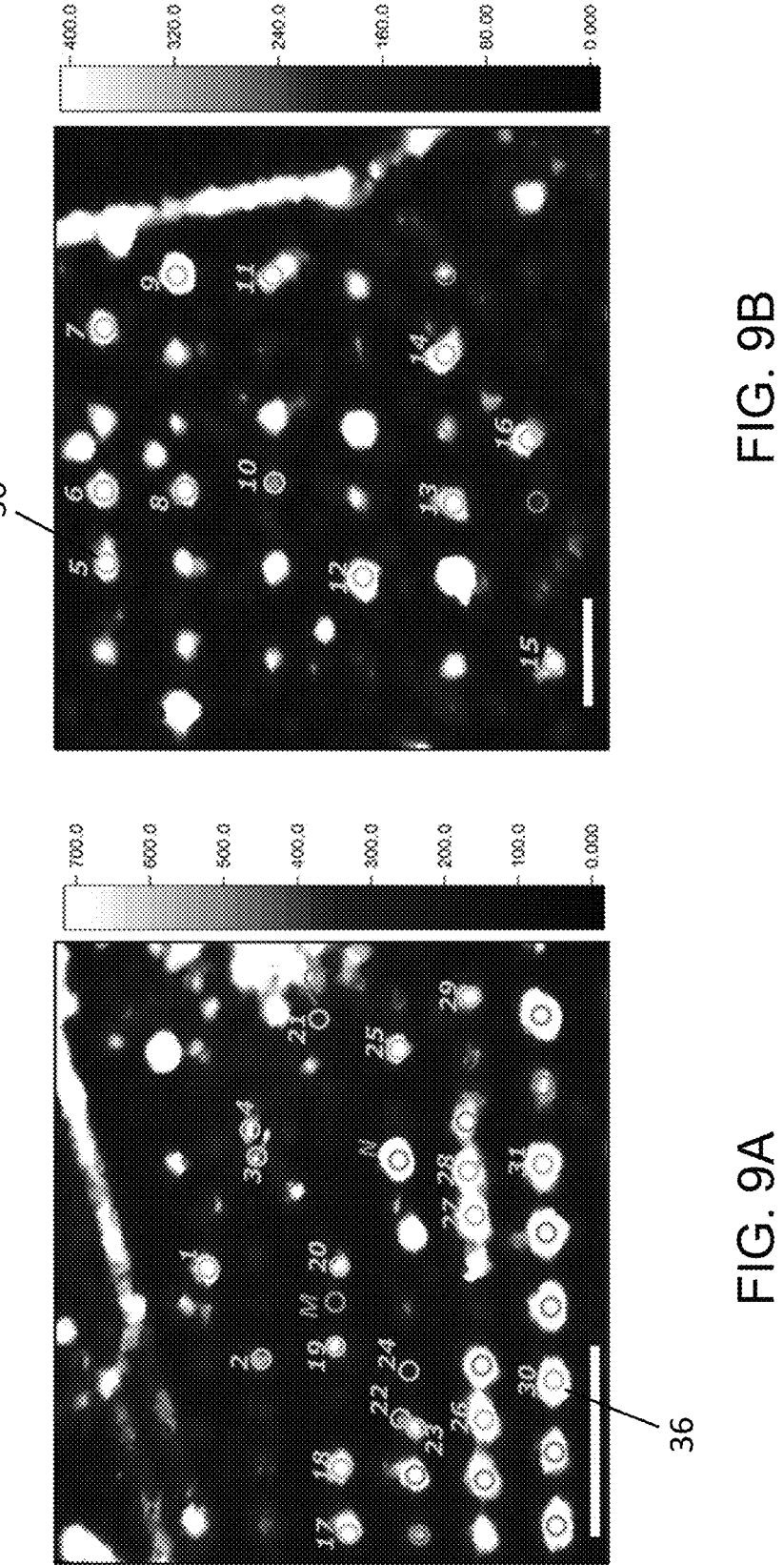
FIGS. 9A and 9B represent notation of all emitters found on the two hBN flakes shown in FIGS. 2B and 2E. SPEs are circled and numbered in yellow, while clustered emitters are marked with magenta circles.

After confirming the existence of hBN emitters 36 at nano-indented sites on both flakes above, their single-photon purity was evaluated using a Hanbury Brown and Twiss (HBT) setup. FIG. 3A represents the measured second-order autocorrelation functions g²(t) of emitters A and B labeled in FIG. 2. Both emitters have g²(0)<0.5 at zero-delay time, confirming that they were single photon sources. The experimental g²(t) data measured in these investigations were well fitted with a three-level model expressed as:

$$g^2(t) = 1 - (1+a) \cdot e^{-\frac{|t|}{\tau_1}} + a \cdot e^{-\frac{|t|}{\tau_2}} \tag{1}$$

where a is the photon bunching amplitude, while $\tau_1$ and $\tau_2$ are lifetimes of the excited and metastable states, respectively. After careful examination, thirty-one SPEs 36 in total were identified out of all indented sites from the two hBN flakes above, as marked in FIGS. 9A and 9B. The radiative decay lifetimes of all SPEs extracted from $g^2(t)$ are plotted in FIG. 3B, ranging from 1.17 ns to 7.88 ns with an average lifetime of 3.86 ns. These results agreed with typical lifetimes previously reported in the literature for room-temperature SPEs in hBN.

Figure 10:
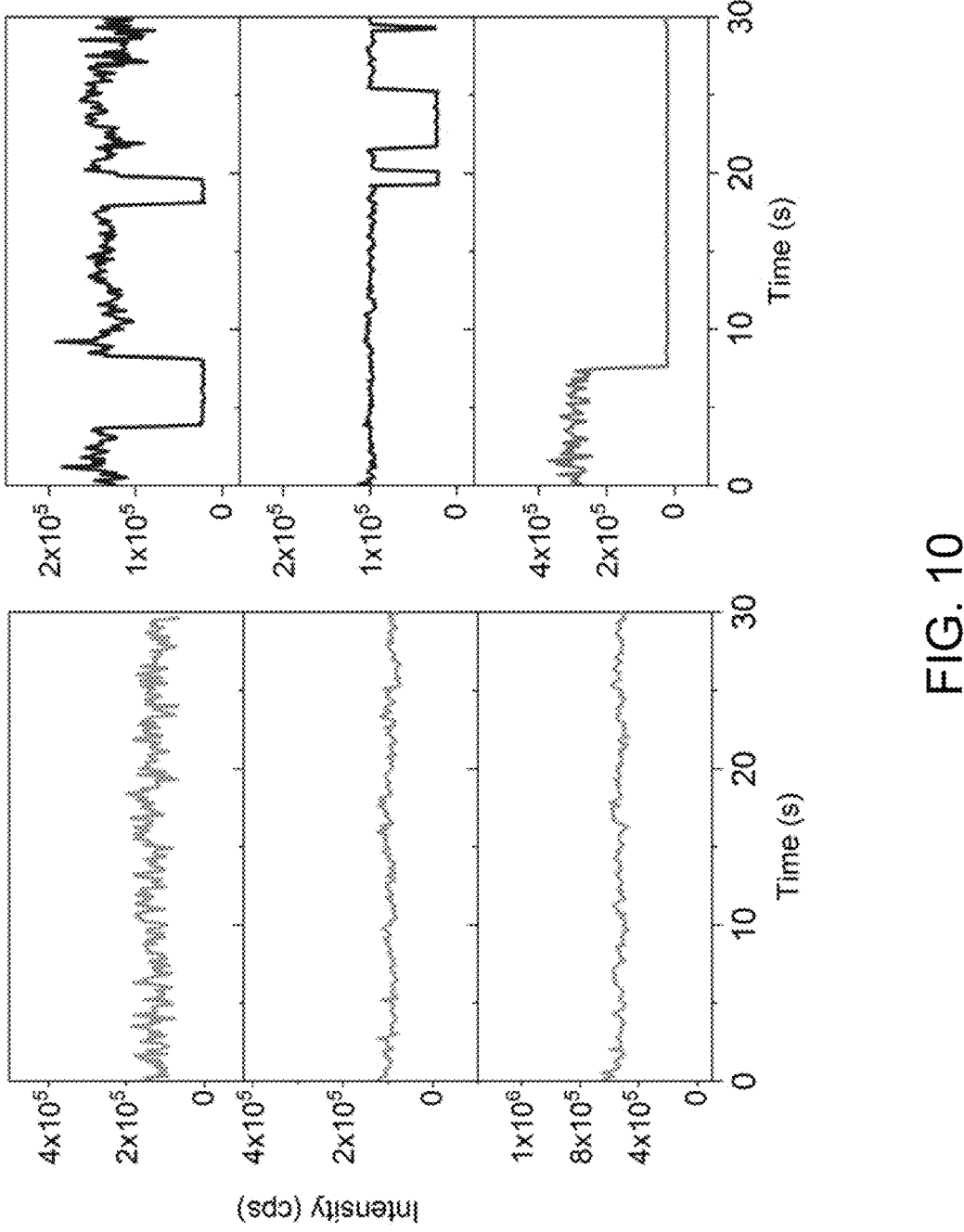
FIG. 10 represents stability of several representative SPEs showing photostable (three orange curves), blinking (two blue curves) and photobleached (one purple curve) emitters.

To measure the brightness of these SPEs 36, PL intensities at a series of incident laser powers were recorded and then fitted using a first-order saturation model: $I=I_{sat} P/(P+P_{sat})$, where $P(P_{sat})$ and $I(I_{sat})$ were the incident (saturated) power and PL intensity, respectively. FIG. 3C represents the fitted saturation curve of one of the brightest emitters that saturated at 4.1 mW with a saturation intensity of 1.1 Mcps, comparable to the brightest hBN emitters created by other techniques. The SPEs 36 produced with this method typically exhibited linearly polarized emission (FIG. 3C inset), indicating an atomic defect with in-plane dipole moment. The photostability of the SPEs 36 was examined by recording their PL time traces when excited by the 532 nm laser at 800 uW. It was observed that roughly 50% of the SPEs 36 maintained stable emission during the optical characterization, while 40% and 10% exhibit blinking and photobleaching behaviors, respectively (FIG. 10).

Blinking has been commonly observed in hBN SPEs as well as in other types of solid-state SPEs. It features switches between an "on" and "off" state with switching rates varying from one SPE to another. One cause of blinking is the existence of other defects near the target SPE, which may modify the SPE charge state from time to time. According to previous reports in the literature, blinking is quite common for hBN SPEs created by deterministic techniques, even after high-temperature annealing which is proved to improve emission stability. This may be related to the complex local environment near SPEs after the hBN lattice structures get modified deterministically by strain, electron/ion irradiation, etc. Strategies to effectively improve the photostability of deterministically formed hBN SPEs are therefore highly desirable.

Figure 11:
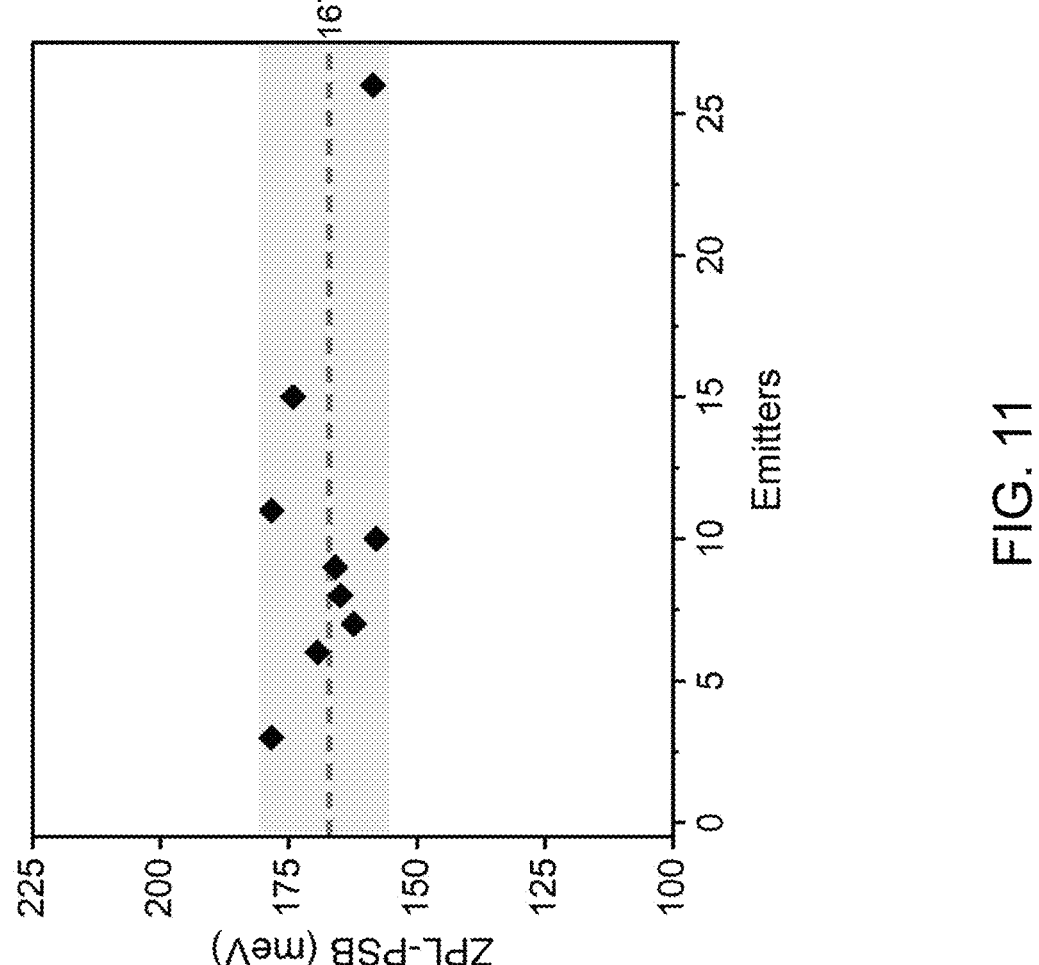
FIG. 11 represents difference in the energy of ZPL and PSB for SPEs that show well-defined PSBs in spectra. The numbering of emitters is consistent with FIGS. 3B and 8A through 8C. The shaded band is a visual aid spanning over 167±10 meV.
Figures 12A, 12B, 12C, 12D:
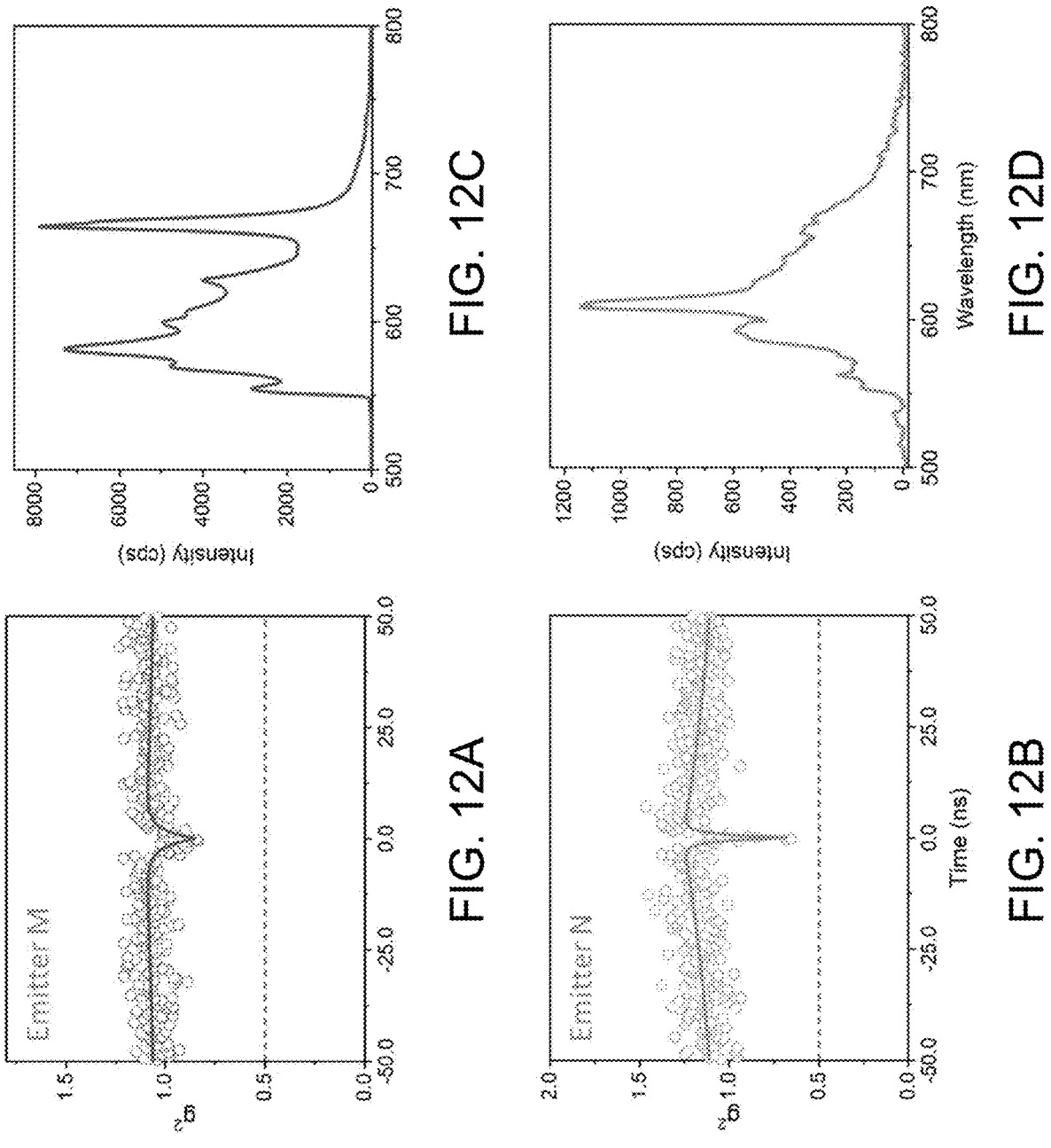
FIGS. 12A and 12B represent second-order autocorrelation measurements of two clustered emitters M and N, both showing $0.5 < g^2(0) < 1$. Locations of emitter M and N are noted in FIG. 9A.
FIGS. 12C and 12D represent corresponding spectra of emitters M and N showing multiple emission peaks and broad emission, indicative of the existence of more than one SPE per site.

FIG. 3D represents a distribution of ZPLs for all photo-stable SPEs from AFM-indented sites. The emitters were classified into three groups with ZPLs centered at 582±6 nm, 602±9 nm and 633±5 nm, all of which match the previously reported ZPLs of hBN SPEs in the visible spectral range. One interesting fact is that, unlike SPEs created by other top-down techniques where a dominating portion of emitters show ZPLs at wavelengths shorter than 590 nm, near 50% of emitters created with the present technique exhibited ZPLs around 602 nm and another 40% show emission centered around 582 nm. 35% of the SPEs showed PSBs in their spectra that were 167±10 meV away from their corresponding ZPLs (FIG. 11), in agreement with previous reports in the literature. The relatively narrow distribution of ZPLs observed here implied that the present technique was promising for deterministically creating hBN SPEs with predictable emission wavelengths.

Aside from SPEs, emitters were also found that possessed some degrees of antibunching with $0.5<g^2(0)<1$. Considering the low fluorescence background of the samples, such emitters were theorized to be composed of more than one SPE within spatially unresolvable spots. Spectra collected from these emitters typically showed broader emission peaks or multi-peaked emission, confirming the existence of multiple SPEs that could not be individually addressed (FIGS. 12A through 12D). To demonstrate the correlation between $g^2(0)$ and indent size of corresponding emitters, the distribution of $g^2(0)$ values were summarized for emitters showing antibunched emission ($g^2(0)<1$) as a function of their lateral indent sizes. Emitters from both hBN flakes are represented in FIGS. 2A and 2D, with average indent sizes of 200 nm, 290 nm, 400 nm and 740 nm, were included for statistics.

Figure 4:
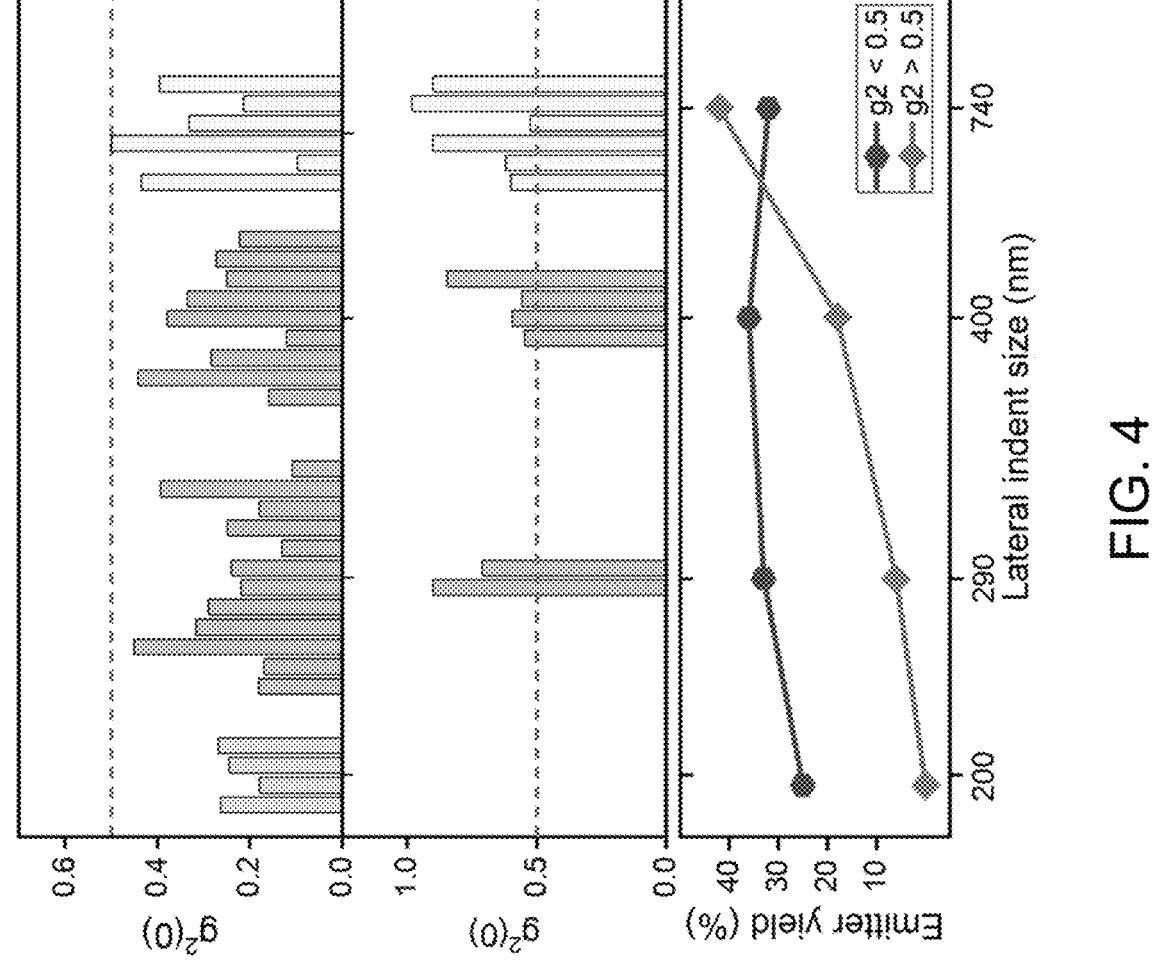
FIG. 4 includes top and middle panels representing $g^2(0)$ values of SPEs ($g^2(0)<0.5$, top) and clustered SPEs ($0.5<g^2(0)<1$, middle) as a function of corresponding indent sizes, and a bottom panel representing yield of SPE and clustered emitters as a function of lateral indent size, calculated by dividing the number of emitters over the total number of indents created for each indent size.

As represented in FIG. 4, SPEs ($g^2(0)<0.5$) were found from all four groups of indents, while clustered emitters ($0.5<g^2(0)<1$) were only found from indents with sizes greater than or equal to 290 nm. After dividing the number of emitters with the total number of indents in each group, the emitter yields were obtained of both clustered emitters and SPEs for different indent sizes, as represented in the bottom panel of FIG. 4. The yield of clustered emitters showed a monotonic increase with indent sizes, from 0% for 200 nm-sized indents to over 40% for an indent size of 740 nm. In contrast, the SPE yield first increased with indent sizes, from 25% for indents of 200 nm up to 36% for indents of 400 nm, then dropped for indents larger than 400 nm. The SPE yields for indents of 290 nm (32%) and 400 nm (36%) were believed to be among the highest values ever reported for hBN SPEs created by top-down methods including FIB and nanopillar arrays. Specifically, indents 30 around 290 nm combine a high SPE yield and relatively small feature size, making them promising for the deterministic integration of hBN SPEs 36 with photonic/plasmonic structures. The effective generation of clustered emitters in larger indents (740 nm) could be useful as well, for example, for sensing applications.

Due to the high-temperature annealing for SPE activation in the present method, it was theorized that the emitters are most likely vacancy-related atomic defects as vacancy diffusion typically dominates at high temperatures. To validate this, a control experiment was performed by annealing additional nano-indented hBN samples in argon at a lower temperature, namely, 800° C.

Figures 13A, 13B, 13C, 13D, 13E:
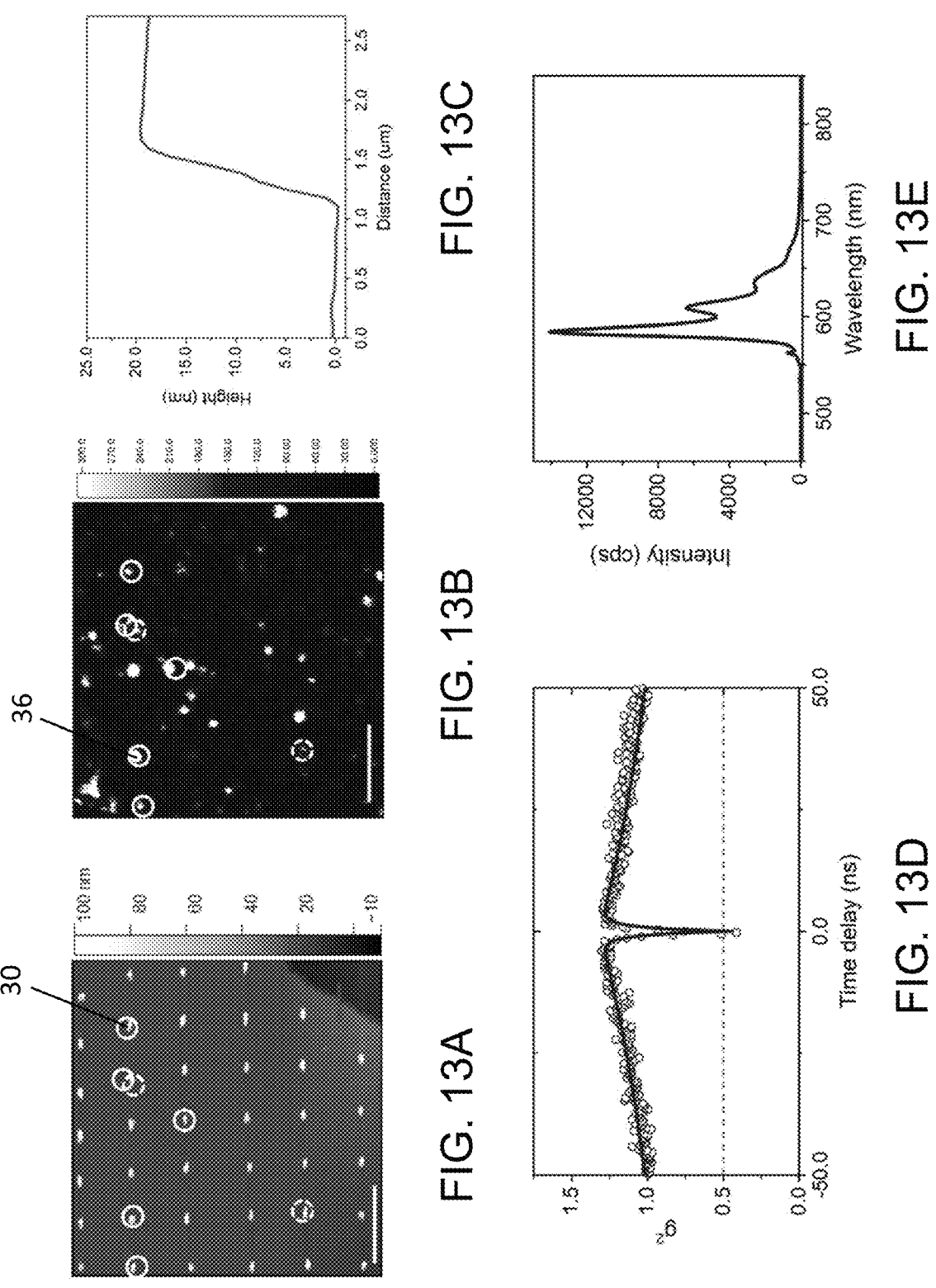
FIG. 13A includes an AFM image of an hBN flake after nanoindentation. The flake was indented with the maximum cantilever displacement $\Delta z_{max}$=350 nm. Scale bar: 2 μm.
FIG. 13B represents a PL map of the same indented areas shown in FIG. 13A after being annealed in argon at 800° C. SPEs and clustered emitters were found and marked with while solid and dashed circles, respectively. Scale bar: 2 μm. The corresponding indents were also circled in FIG. 13A.
FIG. 13C represents a height profile at the flake edge along the red arrow marked in FIG. 13A, showing a flake thickness of about 20.0 nm.
FIG. 13D represents second-order autocorrelation measurement and fitting of an SPE from the area shown in FIG. 13A. The blue circles were experimental data, while the solid blue line was the fitting curve with the three-level model.
FIG. 13E represents a background-subtracted spectrum of the SPE of FIG. 13D, showing a ZPL at 581 nm and a PSB at the longer wavelength.

FIG. 13A shows an exemplary hBN flake 20 with arrays 38 of indents 30 that were created with $\Delta z_{max}=350$ nm, the same $\Delta z_{max}$ that led to an SPE yield of 32% at an annealing temperature of 1000° C. Here, the hBN flake had a thickness around 20 nm (FIG. 13C) that was comparable to the hBN flakes used in the previously discussed investigations. After argon annealing, the samples were characterized with the confocal microscope to identify stable emitters. FIG. 13B includes a PL map of the indented area, with emitters identified in solid and dashed circles corresponding to SPEs 36 and clustered emitters, respectively. SPEs found in this area shared similar photophysical properties with those obtained by annealing at 1000° C. in terms of emission wavelength (FIGS. 13D and 13E). However, the SPE yield was calculated to be 12.8%, much lower than that on hBN flakes annealed at 1000° C. (32%). This observation supported the hypothesis that atomic defects giving single photon emission at indented sites on hBN are vacancy-related structures: as the annealing temperature increases, the diffusion of vacancies is promoted, thus leading to a higher probability of forming vacancy-based defects that act as SPEs.

As represented in FIGS. 13A through 13E, SPEs 36 were found near the indents 30 but with much lower emitter yields compared to hBN flakes annealed at 1000° C. This confirmed that the formation of SPEs was less favorable at lower annealing temperatures possibly due to the reduced vacancy diffusion rate. These observations agreed with resulted reported in the literature where a monotonic increase in emitter yield was reported as a function of annealing temperature. However, further increasing the annealing temperature above 1000° C. is not preferred in practice considering the degradation of involved materials. Other post-AFM treatments such as plasma etching may be used as alternatives to achieve potentially higher SPE yields. As been reported previously in the literature, plasma treatments are capable of generating vacancies in hBN lattices as well as creating hBN SPEs. Adding a plasma etching step after AFM nanoindentation has the potential to promote SPE yield by increasing the probability of forming vacancy-related defects that act as SPEs near the indents.

The determination of hBN SPE locations with nanoscale precision was not achieved in these experiments due to the diffraction-limited resolution of the confocal microscope. Nevertheless, it was inferred that SPEs were most likely formed either at the edge of indented dips 32 or on the bent, delaminated hBN areas 34 next to the dips 32. The former favors SPE formation as defects tend to accumulate at structure/grain boundaries, while the latter could activate strain-induced SPEs due to the large curvature near the bent hBN areas. It is highly possible that both mechanisms played a role, resulting in higher SPE yields than those reported for the at-the-boundary creation or strain engineering. To locate SPEs with a higher resolution, one can use a near-field scanning optical microscope (NSOM), scanning antenna microscope or combined confocal microscope-AFM setup to obtain correlated PL and topographical maps.

A significant advantage of hBN SPEs activated with AFM indentation is the combined high SPE yield and high-precision position control. As demonstrated above, an SPE yield of 32% was obtained for indents 30 less than 300 nm in dimension, which set the new record for deterministic creation of hBN SPEs on non-structured substrates. Notably, indents 30 created by AFM feature sharp, well-defined edges, in contrast to holes/spots induced by radiation methods that typically have poorly defined boundaries due to the diffuse nature of radiation beams. On the other hand, the method herein can be extended to hBN flakes 20 with various thicknesses by simply adjusting the indentation parameters, making the method more versatile than strain engineering with structured substrates as the latter typically requires thin hBN films to achieve desired deformation.

The position-controlled creation of hBN SPEs with AFM nanoindentation according to the method(s) of the present invention may have significant potential for various quantum photonic applications. For example, the method enables the efficient on-chip integration of hBN SPEs 36 with photonic waveguides or cavities by creating SPEs at desired positions, in contrast to previously reports in the literature where hBN SPEs were coupled to photonic structures either randomly or more deterministically, yet with extensive alignment efforts. This method also offers great potential for coupling hBN SPEs to plasmonic nanostructures to achieve strong emission enhancement. Compared to randomly activated SPEs in hBN that do not possess recognizable topographical features, SPEs near the nano-sized indents provide the ability to deterministically assemble plasmonic cavity/antenna structures with high SPE coupling efficiency. In addition, AFM-induced hBN SPEs may be used in other applications that would benefit from deterministic emitter coupling, such as sensing, emission tuning, quantum non-linear optics, etc.

As previously noted above, though the foregoing detailed description describes certain aspects of one or more particular embodiments of the invention [and investigations associated with the invention], alternatives could be adopted by one skilled in the art. For example, the method could include additional steps, the substrate and/or SPEs thereon may differ in appearance and construction from the embodiment described herein and shown in the figures, process parameters such as temperatures and durations could be modified, and appropriate materials could be substituted for those noted. As such, and again as was previously noted, it should be understood that the invention is not necessarily limited to any particular embodiment described herein or illustrated in the drawings.

The invention claimed is:

1. A method of producing single photon emitters (SPEs) on a substrate, the method comprising:
   providing a substrate having a layer of hexagonal boron nitride (hBN) thereon;
   performing nanoindentation of the layer of hBN by inserting a hard indenter tip into a surface of the layer of hBN to produce an array of sub-micron indentations in the layer of hBN on the substrate; and
   annealing the layer of hBN having the sub-micron indentations thereon to activate single-photon emitters (SPEs) at the indentations.

2. The method of claim 1, wherein the substrate comprises an $SiO_2$-coated Si substrate.

3. The method of claim 1, wherein the layer of hBN comprises one or more hBN flakes.

4. The method of claim 3, wherein the hBN flakes have a thickness less than 25 nm.

5. The method of claim 1, further comprising producing the substrate by depositing exfoliated hBN flakes on a non-patterned, planar surface of a $SiO_2$-coated silicon substrate.

6. The method of claim 1, wherein the hard indenter tip is sharp.

7. The method of claim 6, wherein the indenter tip is part of a probe comprising a cantilever coated with the indenter tip.

8. The method of claim 7, wherein the performing nanoindentation comprises inserting the indenter tip against the surface of the layer of hBN in a perpendicular direction to the substrate and displacing the cantilever in the perpendicular direction.

9. The method of claim 1, wherein the performing nanoindentation of the layer of hBN does not deform the substrate.

10. The method of claim 1, wherein the performing nanoindentation is accomplished with no fluorescent contaminants being introduced to the layer of hBN on the substrate.

11. The method of claim 1, wherein the indentations include lateral dimensions between 150 nm and 800 nm formed by controlling vertical displacement of the indenter tip in the step of performing nanoindentation.

12. The method of claim 1, wherein at least some of the SPEs have emission wavelengths of about 583 nm or about 602 nm.

13. The method of claim 12, wherein at least 80% of the SPEs have zero phonon lines (ZPLs) centered at either about 583 nm or about 602 nm.

14. The method of claim 1, wherein the substrate is a chip-compatible substrate.

15. The method of claim 1, wherein the annealing is performed in an argon atmosphere at up to 1000° C. for at least 30 minutes.

16. The method of claim 1, wherein the indentations are defined by a recess in the layer of hBN with bent, delaminated portions of the layer of hBN adjacent thereto.

17. The method of claim 1, wherein the indentations include sharp, well-defined edges.

18. The method of claim 1, wherein the annealing produces an SPE yield of up to 32%.

\* \* \* \* \*